US007129688B2

(12) United States Patent
Gemme et al.

(10) Patent No.: US 7,129,688 B2
(45) Date of Patent: Oct. 31, 2006

(54) METHOD FOR ON-LINE CALIBRATION OF LOW ACCURACY VOLTAGE SENSOR THROUGH COMMUNICATION BUS

(75) Inventors: Carlo Gemme, Pavia (IT); Alessandro Colombo, Milan (IT); Carlo Cereda, Caravaggio (IT); Alfonso Terrazzino, Aragona (IT)

(73) Assignee: ABB Technology AG (CH)

( * ) Notice: Subject to any disclaimer, the term of this patent is extended or adjusted under 35 U.S.C. 154(b) by 0 days.

(21) Appl. No.: 10/500,364

(22) PCT Filed: Dec. 27, 2002

(86) PCT No.: PCT/EP02/14885

§ 371 (c)(1),
(2), (4) Date: Jun. 28, 2004

(87) PCT Pub. No.: WO03/056350

PCT Pub. Date: Jul. 10, 2003

(65) Prior Publication Data

US 2005/0017734 A1    Jan. 27, 2005

(30) Foreign Application Priority Data

Dec. 28, 2001 (EP) ................... 01205184

(51) Int. Cl.
*G01R 11/32* (2006.01)
(52) U.S. Cl. ......................................................... 324/74
(58) Field of Classification Search .................. 324/74
See application file for complete search history.

(56) References Cited

U.S. PATENT DOCUMENTS

| 4,996,646 | A | 2/1991 | Farrington |
| 5,714,886 | A | 2/1998 | Harris |
| 2001/0000355 | A1 | 4/2001 | Santos et al. |

FOREIGN PATENT DOCUMENTS

EP    0 105 786 A1    4/1984

*Primary Examiner*—Jermele Hollington
*Assistant Examiner*—Trung Q Nguyen
(74) *Attorney, Agent, or Firm*—Connolly Bove Lodge & Hutz LLP

(57) ABSTRACT

A method for calibrating voltage sensors in a switchboard, using a communication bus which comprises the following steps: i. performing a measurement using a first voltage sensor; ii. transmitting an information derived from said measurement to an electronic device, through the communication bus; iii. using said information to calibrate a second voltage sensor.

9 Claims, 2 Drawing Sheets

(12) United States Patent — US 7,129,688 B2

METHOD FOR ON-LINE CALIBRATION OF LOW ACCURACY VOLTAGE SENSOR THROUGH COMMUNICATION BUS

CROSS REFERENCE TO RELATED APPLICATIONS

This application is a U.S. National Stage entry of co-pending International Patent Application No. PCT/EP02/14885, filed Dec. 27, 2002 by Colombo, Alessandro et al entitled A METHOD FOR ON-LINE CALIBRATION OF LOW ACCURACY VOLTAGE SENSOR THROUGH COMMUNICATION BUS, the entire contents of which is incorporated by reference, and for which priority is claimed under U.S.C. § 371. As in the parent International Application No. PCT/EP02/14885, priority is also claimed to co-pending European Patent Application No. 01205184.3, filed Dec. 28, 2001, the entire contents of which is incorporated by reference for which priority is claimed under 35 U.S.C. § 119.

BACKGROUND OF THE INVENTION

The present invention relates to a method for on-line calibration of low accuracy voltage sensors through a communication bus. The method of the present invention is particularly useful for calibration of voltage sensors and consequently for voltage measurements in primary and/or secondary distribution electrical sub-stations.

Present solution in primary distribution for voltage measure is well known and is schematically reported in the diagram of FIG. 1. Voltage measure is usually an optional feature, integrated in the bay panel when required by means of standard voltage transformer or voltage sensors. Voltage measurement is normally required for busbar voltage measure on both sides of the circuit breaker and incoming feeders.

Voltage from the secondary winding of the voltage transformer is wired to the analog input of a suitable electronic device to implement the necessary protection, control and metering functions.

Present solutions needs high power voltage transformers in order to supply the information to a high number of devices. This involves also a lot of inter-panel cabling to bring the required information to all the devices.

Voltage measurement is therefore generally carried out when it is aimed at protection functions at a switchboard level, i.e. for under-voltage or over-voltage protection. Using expensive equipments and complicated cabling is much less reasonable and affordable when the voltage information is required for protection functions at a feeder level, such as, for example, for all directional current protection.

SUMMARY OF THE INVENTION

Goal of the invention is the definition of a system architecture allowing for supplying a single circuit breaker electronic device with reliable and accurate voltage measurement.

The definition of such a system architecture consists in the choice of the necessary hardware equipment to implement a calibration procedure, in order to achieve a low cost, high accuracy measure on each load side of a circuit breaker. The system architecture according to the present invention, consists therefore in the proper choice of communication media, electronic devices and voltage sensors, as well as a proper voltage transformers architecture.

In the system according to the present invention, the voltage sensors are directly wired to an electronic device on-board (ED-OB) the circuit breaker (MA e-CB) for better reliability and for sustaining high dynamics of voltage-based protection functions.

When the voltage measurement is located on the load side of a circuit breaker (MA e-CB), equipped with a proper electronic device (ED-OB) it is possible to achieve a high accuracy by implementing an on-line calibration procedure. The method for on-line calibration according to the present invention is based on the availability of a high accuracy and stable voltage transformer (1) on the busbar (busbar). The voltage information coming therefrom (i.e., from the voltage transformer) is communicated to all the electronic devices (ED-OB) which are on-board the circuit breakers (MA e-CB) or present in the switchboard (e.g., ED), so as to calibrate the local low accuracy capacitive voltage sensors 2, 3.

The system architecture and the method according to the present invention have several advantages.

The requirements on the communication are lowered, as the calibration can be made on-line but the information needs to be sent out with a low frequency, i.e. with a minimum time scale. Also, the dynamic has to be higher of the system thermal dynamic only.

It enables the reliability of wired connection of the integrated sensor to the electronic device for protection; at the same time, the accuracy is comparable to a voltage transformer at the basic cost.

The limits of capacitive sensor technology, where a high accuracy is difficult to achieve due to value variation of the capacitance within the operating thermal range, are solved. By calibrating the sensor voltage output with the busbar voltage high accuracy measurement, the temperature dependence is no longer an issue.

It will enable to reduce the cost of capacitive sensors by choosing a low voltage side capacitor for the divider with low cost and accuracy, as accuracy is provided by the calibration procedure.

The system architecture and the method according to the present invention are now described with reference to FIG. 2.

Figure 1:
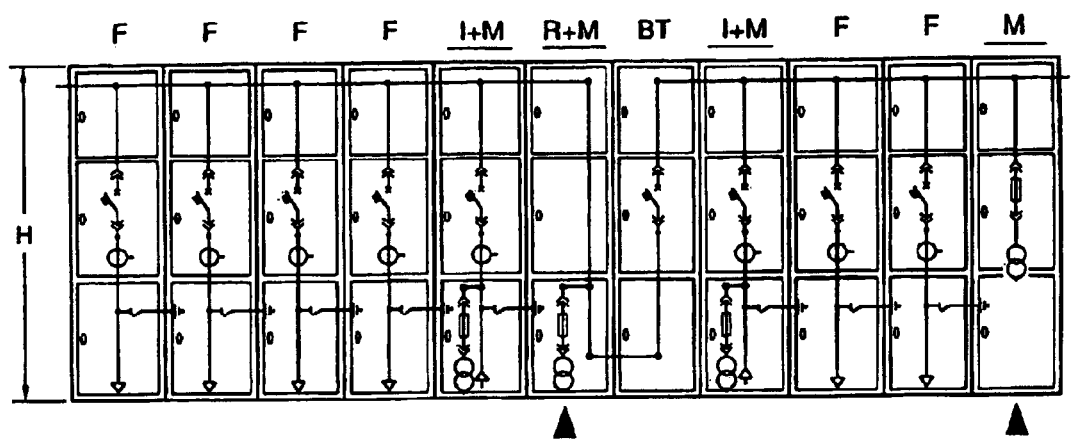
FIG. 1 shows an exemplary block diagram of a background art primary distribution electrical sub-station.
Figure 2:
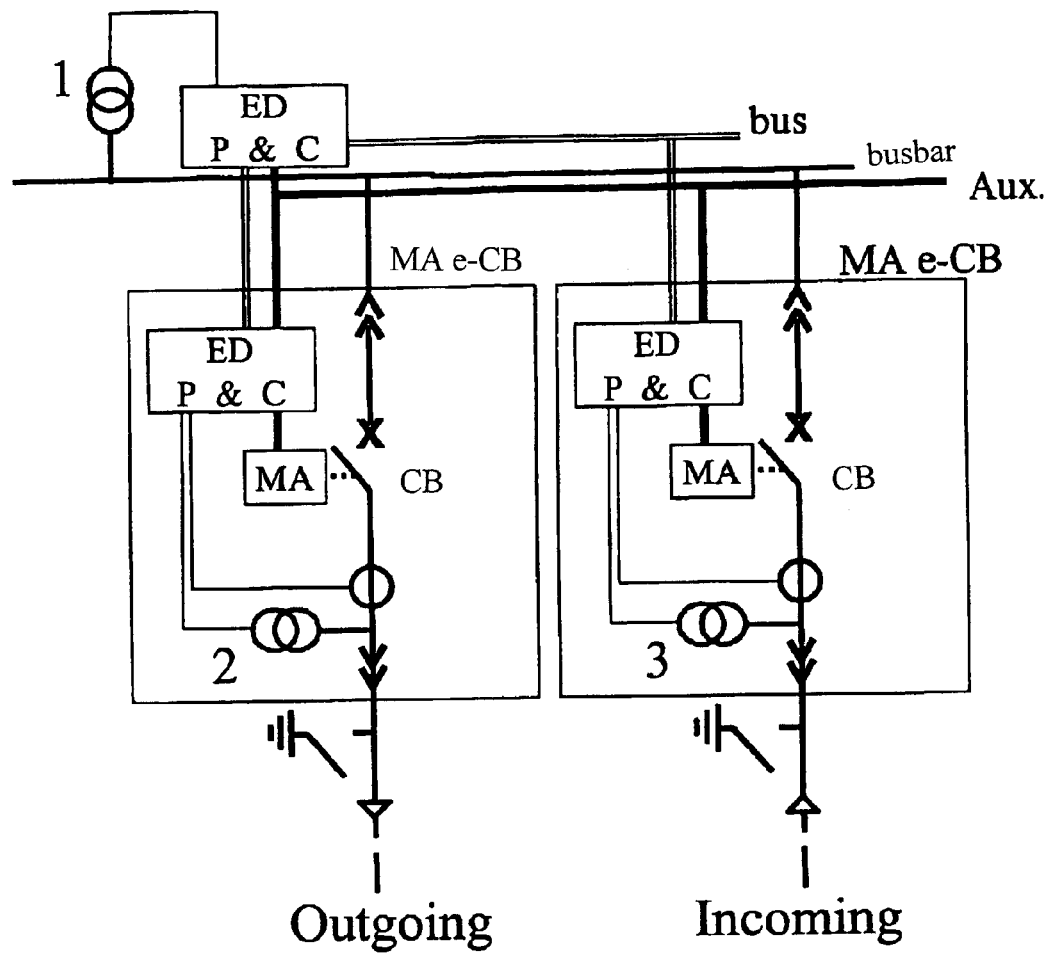
FIG. 2 is an exemplary block diagram of the system architecture and method of the present invention.

Referring to FIG. 2, the voltage transformer, designated with reference numeral 1, on the busbar is connected to an Intelligent Process Unit. In FIG. 2, the Intelligent Process Unit is identified as an electronic device ED, similar to the electronic device on-board (ED-OB) the circuit breaker (MA e-CB). Through this specific electronic device (ED), the voltage measure is available to all the electronic devices (ED, ED-OB) present on the communication bus (bus). The need to transfer the full information, i.e. the data samples, or a processed information, such as module and/or phase, in a continuous manner would impose high requirements on the bus transmission capability. At the same time, if the information is used for protection function, a high dynamic of the order of milliseconds and a high reliability of the information bus are mandatory.

Low cost, low accuracy, i.e. 3% or worse, capacitive sensors are also present and are designated with reference numeral 2 and 3. As the voltage measure is available on each circuit breaker load side through such low cost, low accuracy capacitive sensors, it is possible to directly wire the information to each electronic device, assuring a higher reliability of the local feeder protection functions.

In order to achieve a higher accuracy, the calibration of the sensor output is performed on-line but the information from the voltage transformer is needed only at long intervals, the dynamic required being comparable with the thermal behavior of the system to avoid the temperature dependency of the sensor.

It is therefore possible, using the system architecture and the method according to the present invention, to achieve a reliable measurement of the voltage by using voltage sensors having a relatively7 low accuracy and a relatively low cost.

The invention claimed is:

1. A method for calibrating voltage sensors in a switchboard, said switchboard comprising a circuit breaker, a voltage transformer at busbar level, a first voltage sensor, a second voltage sensor on one of two sides of the circuit breaker, a communication bus and a first electronic device, characterized by the following steps:
   i. performing a measurement using said first voltage sensor;
   ii. transmitting an information derived from said measurement to said first electronic device, through said communication bus; and
   iii. using said information to calibrate said second voltage sensor.

2. A method according to claim 1, characterized in that said first voltage sensor is a voltage transformer.

3. A method according to claim 1, characterized in that said second voltage sensor is a capacitive sensor.

4. A method according to claim 1, characterized in that said second voltage sensor is on the load side of said circuit breaker.

5. A method according to claim 1, characterized in that first said electronic device is on-board said circuit breaker.

6. A method according to claim 1, characterized in that said switchboard further comprises a plurality of electronic devices and a plurality of circuit breakers.

7. A method according to claim 6, characterized in tat said information derived from said measurement is transmitted from said first electronic device to any of said plurality of electronic devices.

8. A method according to claim 7, characterized in that at least a part of said plurality of electronic devices is on-board of at least a part of said plurality of circuit breakers.

9. A method of claim 1, wherein the two sides of the circuit breaker are incoming and outgoing.

* * * * *